United States Patent
Schnekenburger et al.

(10) Patent No.: US 9,215,819 B2
(45) Date of Patent: Dec. 15, 2015

(54) HOUSING FOR ACCOMMODATING ELECTRIC AND ELECTRONIC COMPONENTS

(71) Applicant: Aesculap AG, Tuttlingen (DE)

(72) Inventors: Rolf Schnekenburger, Tuttlingen, DE (US); Erik Schoenewerk, Donaueschingen (DE); Juergen Schneider, Tuttlingen (DE)

(73) Assignee: Aesculap AG, Tuttlingen (DE)

( * ) Notice: Subject to any disclaimer, the term of this patent is extended or adjusted under 35 U.S.C. 154(b) by 379 days.

(21) Appl. No.: 13/690,429

(22) Filed: Nov. 30, 2012

(65) Prior Publication Data

US 2013/0201651 A1 Aug. 8, 2013

(30) Foreign Application Priority Data

Feb. 2, 2012 (DE) .......................... 10 2012 100 882

(51) Int. Cl.
*H05K 5/02* (2006.01)
*H01Q 1/24* (2006.01)
*H01Q 17/00* (2006.01)
*H05K 9/00* (2006.01)

(52) U.S. Cl.
CPC ............. *H05K 5/0247* (2013.01); *H01Q 1/241* (2013.01); *H01Q 17/00* (2013.01); *H05K 9/0007* (2013.01)

(58) Field of Classification Search
CPC .............................. H05K 5/0247; H01Q 1/241
USPC .................................................. 361/818, 616
See application file for complete search history.

(56) References Cited

U.S. PATENT DOCUMENTS

| 5,336,099 A | * | 8/1994 | Aldous et al. ................. 439/131 |
| 5,394,160 A | | 2/1995 | Iwasaki |
| 5,918,163 A | | 6/1999 | Rossi |
| 6,012,950 A | * | 1/2000 | Vanbesien ................ 439/607.41 |

(Continued)

FOREIGN PATENT DOCUMENTS

| DE | 10 2009 018 143 A1 | 10/2010 |
| EP | 0 890 343 A2 | 1/1999 |

(Continued)

OTHER PUBLICATIONS

German Application Serial No. 102012100882.5, German Search Report Jul. 12, 2012, 6 pgs. (with partial English translation).

*Primary Examiner* — Dion R Ferguson
*Assistant Examiner* — Mandeep Buttar
(74) *Attorney, Agent, or Firm* — RatnerPrestia

(57) ABSTRACT

A housing for accommodating electric and electronic components is EMC safe in the manner of a Faraday cage. At least one accommodating chamber, open toward the outside of the housing and otherwise substantially closed to all sides, is formed in at least one outer wall of the housing. At least one non EMC safe transmitter in the form of a non EMC safe transmitting or receiving device is adapted to provide wireless communication between housing side control electronics and an external control device. A functional component is adapted to be controlled by the housing side control electronics. The transmitter may be an antenna, the arrangement thereof inside the accommodating chamber ensuring that it is located outside the EMC protection or shielding. The functional component can be a peristaltic-type pump that is protected by the arrangement inside the accommodating chamber and does not protrude from the housing.

9 Claims, 2 Drawing Sheets

(56) References Cited

U.S. PATENT DOCUMENTS

| | | | |
|---|---|---|---|
| 6,333,860 B1 * | 12/2001 | Oliphant et al. | 361/818 |
| 8,493,009 B2 | 7/2013 | Hafner et al. | |
| 2002/0169003 A1 | 11/2002 | Jinushi | |
| 2009/0051621 A1 | 2/2009 | Liang et al. | |

FOREIGN PATENT DOCUMENTS

| | | |
|---|---|---|
| EP | 1 158 458 A2 | 11/2001 |
| EP | 1 632 190 A1 | 3/2006 |

* cited by examiner

HOUSING FOR ACCOMMODATING ELECTRIC AND ELECTRONIC COMPONENTS

CROSS REFERENCE TO RELATED APPLICATIONS

This application claims the benefit of priority of German Application No. DE 10 2012 100 882.5, filed Feb. 2, 2012, the content of which is incorporated by reference herein in its entirety and for all purposes.

FIELD

The present invention relates generally to a housing for accommodating electric and/or electronic components, and in particular to a control housing having incorporated control electronics, the housing being EMC safe in the manner of a Faraday cage.

BACKGROUND

One example of a control housing applied in the field of medicine and surgery is distributed by the applicant of the present invention under the registered trademark "Microspeed® Uni". This housing unifies a number of control and regulating functions. These functions may be applied to medical instruments or tools which are utilized for various medical, surgical or cosmetic applications. The instruments or tools are connected to connectors at the housing side via plugs at the instrument or tool side. The housing itself and the control electronics accommodated therein, respectively, are connectable via a multi-pole plug connection and an appropriate multi-pole cable to a pedal-operated switch by which corresponding switching or functioning instructions which are in turn converted to corresponding functions of the medical instruments or tools can be output to the housing-side control electronics. At the front side of the housing furthermore a display including a touch panel is provided so as to be able to enter control instructions, functional parameters etc. separately from or additionally to the pedal-operated switch.

Furthermore at the front side of the housing a pump attached thereto, especially a roller or peristaltic-type pump, is provided by which a cooling and/or rinsing fluid can be conveyed to the field of operation or treatment so as to cool a tool running there, to rinse the field of operation etc. The control of the pump usually is performed via the afore-mentioned pedal-operated switch.

Since the housing accommodates electric and/or electronic components, i.e. the control electronics, and the pump conveys a liquid, usually water, it is indispensable for safety reasons that the housing in which the control electronics is provided and the pump are delimited against each other in a fluid-tight manner. This is achieved by the fact that the pump or the housing encapsulating the pump, respectively, is attached to the front side of the actual control housing.

Moreover, the housing must be designed to be EMC tight, i.e. it must act in the manner of a Faraday cage so as to operate in a fail-safe way.

Recently the demand for a wireless and cable-less control option of the housing side control electronics has occurred, i.e. the connection between the pedal-operated switch and the housing is no longer intended to be performed via the multi-wire cable but wireless via an appropriate close-up range radio technology. Due to the EMC tight or EMC safe design of the housing, this requires the arrangement of a transmitting and/or receiving device outside the shielding of the housing so that the wirelessly transmitted instructions can be received by the pedal-operated switch. Such transmitting and/or receiving device located outside the housing or the housing shielding is a drawback or a problem, however, in so far that it constitutes an undesirable mounting or build-up at the housing which protrudes from the outer contour of the housing in an undesirable and unattractive way. Moreover, such mounting or build-up can impede or prevent plural control housings from being juxtaposed or stacked or from inserting them into a rack.

This applies mutatis mutandis to the pump adapted to be mounted to the housing front side: It protrudes to a considerable extent from the surface of the housing front side and in so far is undesirable both aesthetically and in practice, i.e. during operation, as this is a protruding obstacle which naturally is contact-sensitive, at which objects or passing persons can get caught etc.

On the other hand, it is desirable to configure a housing of the type in question so that in operation, high functionality and safety is obtained, wherein especially an unrestricted wireless communication path is to be ensured between the housing-side control electronics and an external control device without the need for any mountings or build-ups at the housing that are susceptible to accidents during operation.

SUMMARY

The present invention suggests a housing for medical purposes in which at least one accommodating chamber open toward the outside of the housing and otherwise substantially closed to all sides is formed in at least one housing side wall, the limiting walls of which accommodating chamber are designed to be EMC safe. Furthermore, in the accommodating chamber at least one non EMC safe transmitter in the form of a non EMC safe transmitting and/or receiving device can be disposed which is adapted to provide a wireless communication between the housing side control electronics and an external control device, and further a functional component adapted to be controlled by the housing side control electronics can be disposed in the EMC safe accommodating chamber.

The functional component controllable by the housing side control electronics which, according to a possible configuration of the present invention, can be a medical pump, especially a peristaltic-type pump, therefore is displaced from the housing front plate from which it has protruded so far by an amount corresponding to the constructional depth of the pump or the pump housing into the accommodating chamber so that ideally the functional component is arranged to be located in the accommodating chamber such that the visible front side of the component and the housing side wall in which the accommodating chamber is formed substantially constitute one plane. Due to the fact that the limiting walls of the accommodating chamber are equally designed to be EMC safe, the formation of the accommodating chamber in the at least one housing side wall causes no breakthrough of the EMC shield of the entire housing so that the operating safety continues to be ensured. Since, furthermore, the non EMC safe transmitter in the form of the transmitting and/or receiving device is equally arranged in the accommodating chamber, the transmitter, on the one hand, is provided outside the EMC safe or shielded housing, i.e. it can perform an unrestricted close-up range communication with the external control device, on the other hand the transmitter is displaced away from the outer shell of the housing by the arrangement in the area of the accommodating chamber and thus constitutes no disturbing unit at the outer housing wall. Since finally the accommodating chamber is substantially closed to all sides by its limiting walls (except for the aperture facing the outside of the housing), the operating safety is given quasi without restriction inside the housing despite the accommodation of the fluid-guiding pump.

Advantageous further developments and configurations of the invention are the subject matter of the subclaims.

According to a preferred embodiment, the non EMC safe transmitter is an antenna, for instance an antenna distributed under the trademark "Bluetooth®", for performing wireless communication between the housing-side control electronics and the external control device, for example the pedal-operated switch or switches.

A possible embodiment of the present invention suggests the fact that the transmitter (the antenna) and the functional component controllable by the housing side control electronics (e.g. the pump) are combined to form one unit. The transmitter or the antenna is thus provided inside the functional component, i.e. it is quasi encapsulated or encased and additionally protected by the same.

In another embodiment the transmitter can be arranged in a clearance between the functional component and the limiting walls of the accommodating chamber. The transmitter (the antenna) is thus guided out of the functional component, i.e. it is a component assigned to the housing which remains in the latter when the component is removed from the accommodating chamber.

The transmitter can communicate with the housing side control electronics via at least one shielded cable connection, the shielded cable connection including at least one signal cable and/or at least one power supply cable. Although it is indispensable in the case of a shielded cable connection to guide the cable or cables through the housing wall and, thus, through the EMC shield, however the opening required to this effect in the EMC shield is negligible related to the entire shielding surface so that no drawbacks are resulting herefrom.

The shielded cable connection moreover can have at least one releasable plug connection. This facilitates the removal of the component from the accommodating chamber and especially the exchange of various components for each other, because merely the plug connection has to be released for this purpose.

The releasable plug connection furthermore can have at least one plug connector on the side of the functional component and at least one complementary mating plug connector, e.g. on the side of the bottom wall of the accommodating chamber, the plug connector and the mating plug connector being in contact with each other upon insertion of the functional component into the accommodating chamber. This connecting principle which is known per se from insert cases or racks constitutes a particularly preferred embodiment of the plug connection.

As already explained in the foregoing, according to an embodiment the functional component can be a pump, especially a peristaltic-type pump. However, it is understood that the subject matter of the present invention is not restricted hereto.

In particular for safety reasons, however also due to aesthetic considerations, it can be of advantage to close the accommodating chamber at least partially by a diaphragm while the functional component is inserted, for instance while the pump is inserted. "Diaphragm" in this context means any closing member by which the aperture of the accommodating chamber can be at least partially closed, i.e. for instance a flap, a roller closure, a slide or the like.

BRIEF DESCRIPTION OF THE DRAWINGS

Various details, aspects and advantages explained in the foregoing summary and the following detailed description will be better understood when viewed in conjunction with the drawing figures, of which.

DETAILED DESCRIPTION

Although the invention is illustrated and described herein with reference to specific embodiments, the invention is not intended to be limited to the details shown. Rather, various modifications may be made in the details within the scope and range of equivalents of the claims and without departing from the invention.

Figure 1:
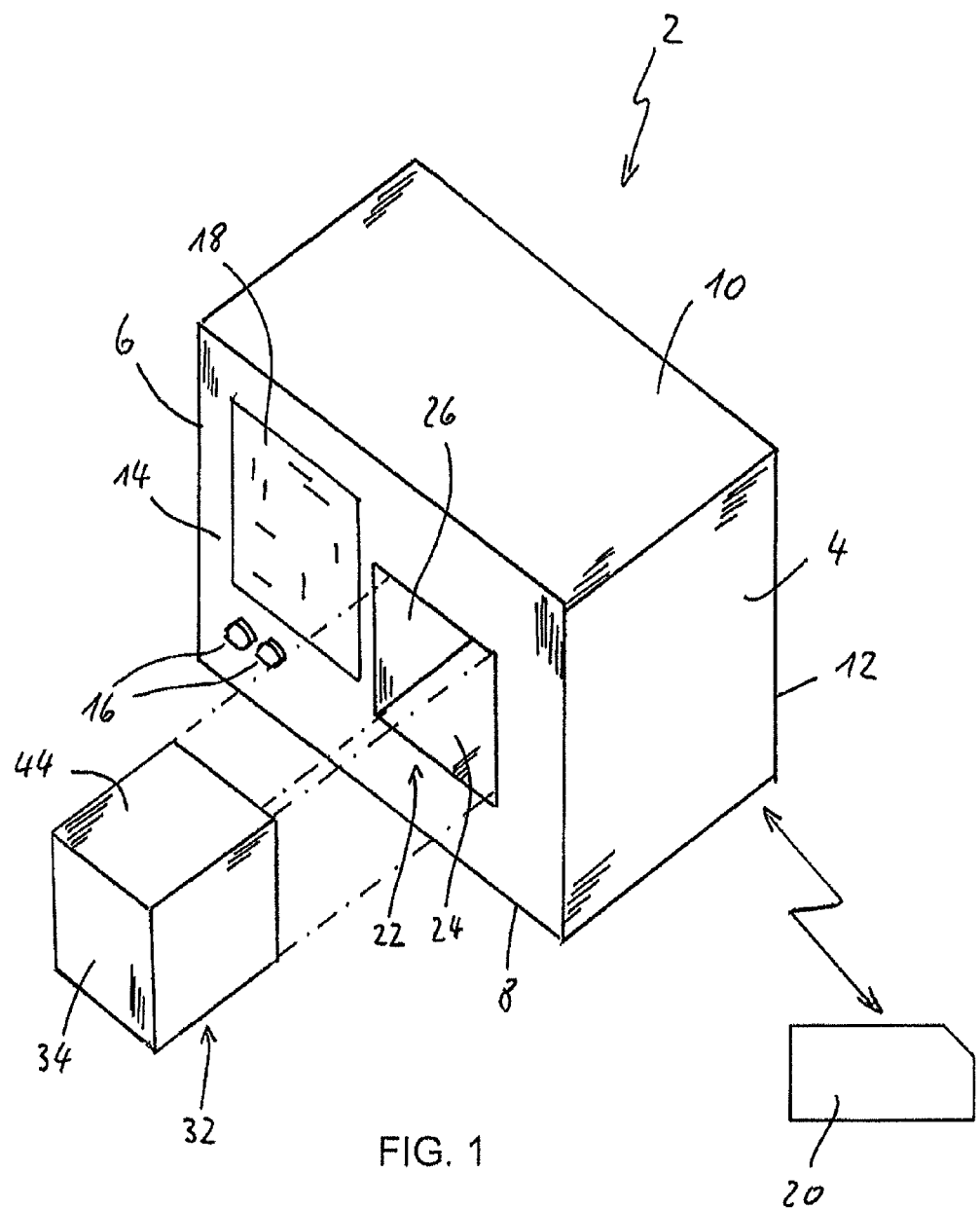
FIG. 1 shows a schematically simplified perspective view of a housing according to an exemplary embodiment of the invention and a functional component adapted to be disposed in the housing.

A housing 2 has the box-type structure shown in FIG. 1 in the form of a parallelepiped having two side walls 2 and 4, a bottom wall 8, a ceiling wall 10, a rear wall 12 and a front wall 14.

The size and the shape of the housing 2 are configured corresponding to the respective applications and purposes of use, i.e. the shape of the housing 2 illustrated in FIG. 1 is merely exemplary and is not restrictive.

The housing 2 serves for receiving electric and/or electronic components not illustrated in detail in the drawing and is especially a control housing having mounted control electronics, the housing being EMC safe in the manner of a Faraday cage. The necessary technical measures for the EMC shielding of housings are common technical knowledge so that this shall not be discussed in detail.

In the illustrated embodiment, housing 2 is a control housing for medical or surgical purposes so that the housing side control electronics serves for supplying and controlling corresponding treatment devices or treatment instruments. Said devices or instruments can be connected via appropriate connectors 16 or similar plug connections provided on the front wall 14. In the front wall 14 equally an operating and/or display panel 18 is provided by which specific settings, functional parameters etc. can be set, monitored or recalled.

An external control device 20 is designed especially but not exclusively in the form of a pedal-operated control or a pedal-operated switch and includes at least one foot-operated pedal so as to apply commands or information to the housing side control electronics, which commands or information then are converted—possibly following an appropriate programming—to instructions or control commands that are output via the connectors 16.

The external control device 20 communicates with the housing side control electronics wirelessly by means of a close-up range communication, for example Bluetooth®, as schematically illustrated in FIG. 1 by the arrows. This means that no cable does extend between the control device 20 and the housing 2 for unidirectional or bidirectional signal transmission.

The housing 2 includes in at least one of its side walls, in the shown embodiment in the front wall 14, at least one aperture behind which an accommodating chamber 22 is formed in the housing 2 into the interior of the housing. The accommodating chamber 22 is formed to be substantially closed to all sides except for the aperture in the front wall 14 and accordingly includes the limiting walls 24, 26 and 28 shown and visible in the drawing as well as a bottom wall 30. The limiting wall 24 is opposed to the limiting wall 28 and the limiting wall 26 is opposed to a limiting wall which is not visible in any of the Figures.

As is proven by FIG. 1, the accommodating chamber 22 serves for receiving a functional component 32 which, according to the Figures, has an outer shape adapted to that of the accommodating chamber 22 (wherein in practice the situation that the accommodating chamber 22 has to be adapted to the outer contour of the component 32 should be prevailing; in this respect, the graphical representation of both the accommodating chamber 22 and the component 32 is to be understood to be merely exemplarily or schematically illustrative).

The functional component 32 is a functional unit or a functional block executing particular functions while being controlled by the housing side control electronics which, in turn, is instructed by the external control device 20. A concrete and non-restrictive example of the functional component 32 is a fluid pump, for instance a roller pump or peristaltic-type pump, by which cooling or rinsing liquid can be conveyed. Other examples of the functional component 32 are, for example, compressed air generators, suction devices or the like.

In order not to interrupt the EMC safety or EMC encapsulation of the housing 2 by the accommodating chamber 22 all walls limiting the accommodating chamber 22 (side walls 24, 26, 28 and the wall opposing the wall 26 as well as the bottom wall 30) are equally configured to be EMC safe.

Figure 2:
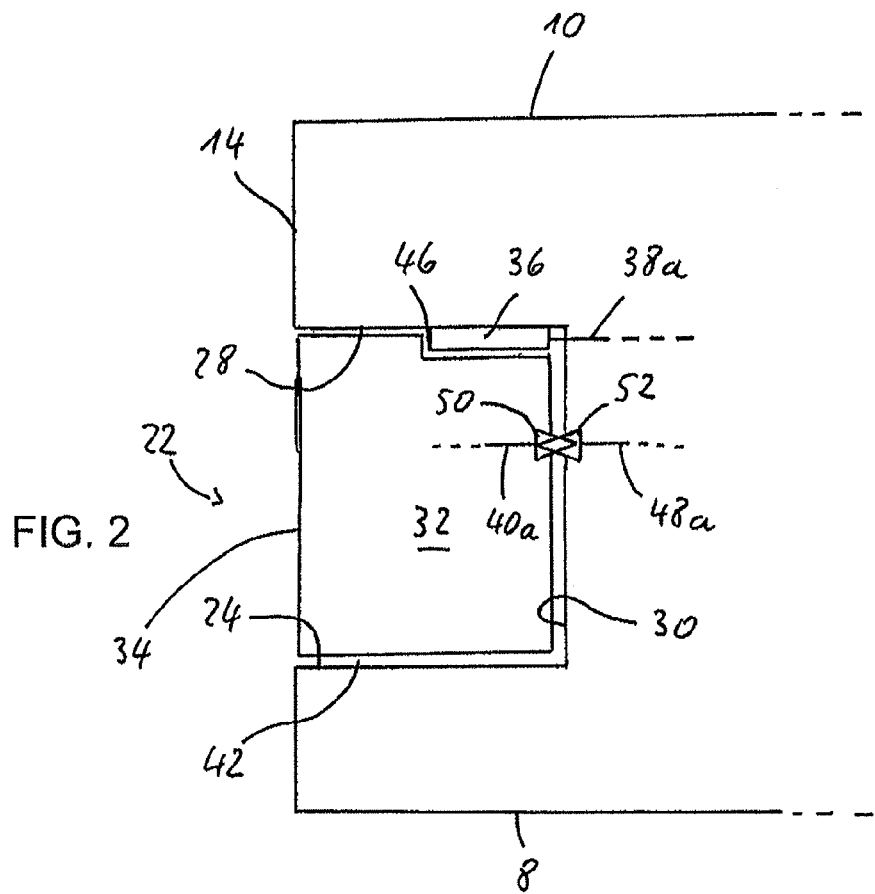
FIG. 2 shows a simplified sectional side view across the housing according to an exemplary embodiment of the invention.
Figure 3:
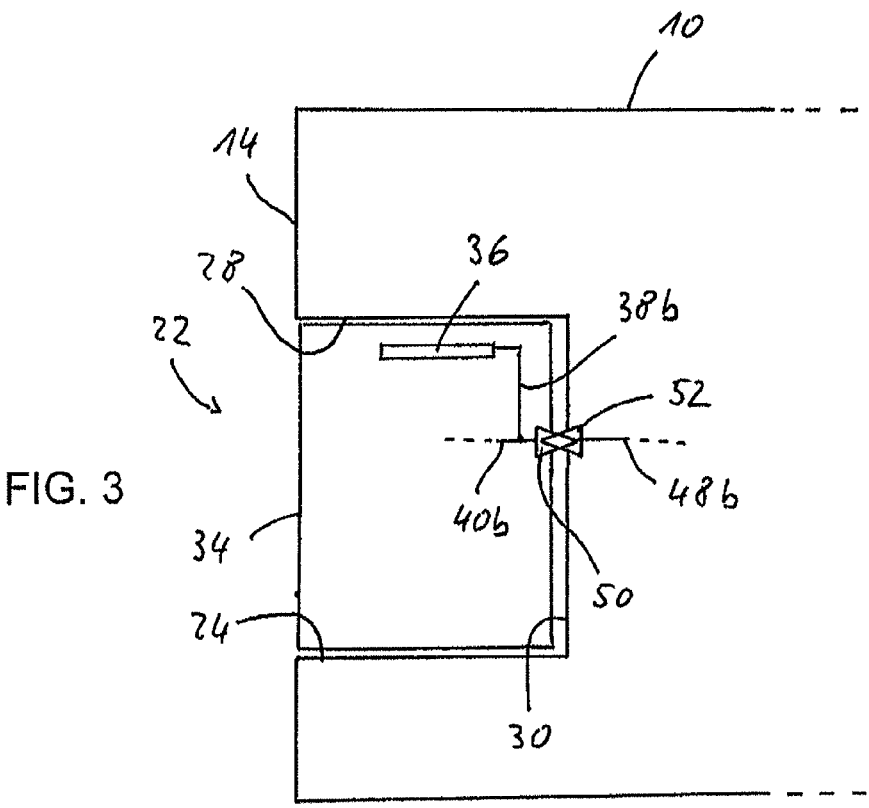
FIG. 3 shows a view corresponding to FIG. 2 of another embodiment.

FIGS. 2 and 3 illustrate in a simplified lateral sectional view in which way the functional component 32 is inserted in the accommodating chamber 22. The depth of the component 32 as well as of the accommodating chamber 22 is preferably designed so that, as is proven by FIGS. 2 and 3, a front face 34 of the component 32 is substantially flush with the front wall 14 of the housing 2, when the component 32 is accommodated in the accommodating chamber 22. In other words, the component 32 does not protrude or protrudes only insignificantly from the plane of the front wall 14.

The flush or substantially flush accommodation of the component 32 in the accommodating chamber 22 allows closing the accommodating chamber 22, especially for safety reasons but also for aesthetic considerations, while the component 32 is inserted, at least partly by a diaphragm not shown in detail in the drawing. In this context, by "diaphragm" any closing element is understood by which the aperture of the accommodating chamber 22 is adapted to be closed at least partially, i.e. for example a flap, a roller closure, a slide or the like.

In order to permit wireless communication between the external control device and the housing side control electronics despite the EMC safe design of the housing 2 (and of the accommodating chamber 22) a non EMC safe transmitter in the form of a non EMC safe transmitting and/or receiving device is provided on the side of the housing 2. Said transmitter is illustrated in the FIGS. 2 and 3 denoted with the reference numeral 36. The transmitter 36 can be, for instance, in the form of a transmitting/receiving antenna (transceiver) and is communicated with the housing side control electronics via a single-wire or multi-wire line 38a (FIG. 2) or 38b (FIG. 3). Furthermore components, drives etc. inside the component 32 are communicated via a cable 40a (FIG. 2) or a cable 40b (FIG. 3) with the housing side control electronics and/or a power pack etc. provided there.

In the embodiment of FIG. 2 the transmitter or the antenna 36 is provided in a clearance 42 between the outer circumference of the component 32 and the accommodating chamber 22, that is to say e.g. between the limiting wall 28 and an upper side 44 of the component 32. The transmitter 36 can be fixed to the limiting wall 28 and the upper side 44 of the component 32 includes a corresponding recess or depression 46 adapted as to shape, size and course to the transmitter 36 and permitting unobstructed insertion or removal of the component 32 into or from the accommodating chamber 22 despite the transmitter 36 provided at the limiting wall 28.

The cable or line 38a is laid, starting from the transmitter 36, through a corresponding aperture in the bottom wall 30 to the housing side control electronics. The line 38 passes through the bottom wall 30 in a corresponding aperture.

In the embodiment of FIG. 3 the transmitter 36 is provided inside the component 32, wherein then the transmitter 36 can be designed also specifically for the respective component 32, for instance.

According to FIG. 2, the cable or the line 40a leading out of the component 32 preferably ends in a plug connector 50 adapted to be inserted into a corresponding mating plug connector 52 when the component 32 is completely accommodated in the accommodating chamber 22. A line 48a starting from the mating plug connector 52 then leads to the housing side control electronics, a housing side power supply etc.

In the embodiment of FIG. 3 the line 38b starting from the transmitter 36 is guided to the component side line 40b and then leads via the plug connector 50 and the mating plug connector 52 to the housing side line 48b.

The fact that the transmitter (the antenna) 36 in both embodiments is located outside the EMC shielding of the housing 2 ensures an unobstructed communication between the external control device 20 and the housing side control electronics. Moreover, the transmitter 36 is quasi invisible and protected in the accommodating chamber 22 and in the component 32, respectively, that is to say it neither builds up at one of the outer surfaces of the housing 2 in any way, nor is it exposed to the risk of bending, breaking or the like. The outer surfaces of the housing 2 and in this case especially the two side walls 2 and 4 and the bottom wall 8 and the ceiling wall 10 can be formed evenly, i.e. without any projections so that also a plurality of housings 2 configured according to the invention can be juxtaposed and/or stacked above each other. Also the insertion of the housing 2 into a multi-equipment carrier or a rack is not impeded by any protruding antenna elements or the like.

Due to the fact that the limiting walls of the accommodating chamber 22 are substantially closed (except for the lead-through of the line 38a in FIG. 2 as well as of the mating plug connector 52 in FIGS. 2 and 3, wherein these lead-throughs easily can also be designed in a fluid-tight manner), there is no risk that when the component 32 is a fluid conveying pump or fluid suction pump, the respective fluid in question can enter into the interior of the housing 2.

It is understood that within the scope of the present invention even further modifications or alterations are imaginable. For instance, the number of accommodating chambers is not restricted to the individual number shown in FIG. 1, but also plural accommodating chambers of this type can be provided not only in the front wall 14 but also in the other outer walls of the housing 2. Also, the accommodating chambers 22 need not be of equal size and/or equal shape.

If—as explained already further above—the functional component 32 is a fluid conveying pump or fluid suction pump or any other mechanically driven element, in addition to the line 38a and/or the line 48a (48b) a mechanical drive can be guided through the bottom wall 30, for example a drive shaft including a coupling element at the free end which then engages in a corresponding mating coupling element on the side of the component 32, when the component 32 has been inserted in the accommodating chamber 22. The leading of the drive shaft through the bottom wall 30 is preferably designed to be fluid-tight.

In summary, in so far a housing for accommodating electric and/or electronic components has been described, especially not exclusively a control housing having mounted control electronics, however, wherein the housing is EMC safe in the matter of a Faraday cage. In at least one outer wall of the housing at least one accommodating chamber open toward the outside of the housing and otherwise substantially closed to all sides is formed whose limiting walls are equally configured to be EMC safe. In the accommodating chamber at least one non EMC safe transmitter in the form of a non EMC safe transmitting and/or receiving device adapted to provide wireless communication between the housing side control electronics and an external control device and a functional component adapted to be controlled by the housing side control electronics can be arranged. The transmitter preferably is an antenna the arrangement of which inside the accommodating chamber ensures that it is located outside the EMC protection or shielding. The functional component can be, for instance, a pump, especially a peristaltic-type pump, which is protected by the arrangement inside the accommodating chamber and does not protrude from the housing.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. A housing of a medical device for accommodating electric or electronic components, the housing comprising housing side control electronics and at least one housing outer wall, the housing being EMC safe in the manner of a Faraday cage, wherein at least one accommodating chamber is formed in said at least one housing outer wall, the at least one accommodating chamber being open toward the outside of the housing and otherwise substantially closed, the at least one accommodating chamber comprising limiting walls that are configured to be EMC safe;

wherein, in the accommodating chamber, at least one non EMC safe transmitter in the form of a non EMC safe transmitting or receiving device adapted to provide wireless communication between the housing side control electronics and an external control device and a functional component adapted to be controlled by the housing side control electronics can be arranged; and wherein the transmitter is guided out of the functional component and arranged in a clearance between the functional component and the limiting walls of the accommodating chamber.

2. The housing according to claim 1, wherein the transmitter is an antenna.

3. The housing according to claim 1, wherein the transmitter and the functional component adapted to be controlled by the housing side control electronics are combined to form a unit.

4. The housing according to claim 1, wherein the transmitter communicates with the housing side control electronics via at least one shielded cable connection.

5. The housing according to claim 4, wherein the at least one shielded cable connection includes at least one signal cable and at least one power supply cable.

6. The housing according to claim 4, wherein the at least one shielded cable connection has at least one releasable plug connection.

7. The housing according to claim 6, wherein the at least one releasable plug connection includes at least one plug connector on the side of the functional component and at least one complementary mating plug connector on the side of a limiting wall, especially a bottom wall of the accommodating chamber, the plug connector and the mating plug connector contacting each other upon insertion of the functional component into the accommodating chamber.

8. The housing according to claim 1, wherein the functional component is a pump, especially a peristaltic-type pump.

9. The housing according to claim 1, wherein the at least one accommodating chamber is at least partially closable by a diaphragm when the functional component is inserted.

* * * * *